US008926851B2

(12) United States Patent
Lille et al.

(10) Patent No.: US 8,926,851 B2
(45) Date of Patent: Jan. 6, 2015

(54) METHOD FOR MAKING A FILM OF UNIFORMLY ARRANGED CORE-SHELL NANOPARTICLES ON A SUBSTRATE

(71) Applicant: HGST Netherlands B.V., Amsterdam (NL)

(72) Inventors: Jeffrey S. Lille, Sunnyvale, CA (US); Ricardo Ruiz, Santa Clara, CA (US); Lei Wan, San Jose, CA (US); Gabriel Zeltzer, Redwood City, CA (US)

(73) Assignee: HGST Netherlands B.V., Amsterdam (NL)

( * ) Notice: Subject to any disclaimer, the term of this patent is extended or adjusted under 35 U.S.C. 154(b) by 116 days.

(21) Appl. No.: 13/680,091

(22) Filed: Nov. 18, 2012

(65) Prior Publication Data

US 2014/0138352 A1 May 22, 2014

(51) Int. Cl.
| | | |
|---|---|---|
| *C23F 1/00* | (2006.01) | |
| *C23C 16/44* | (2006.01) | |
| *C23C 16/455* | (2006.01) | |
| *G11B 5/84* | (2006.01) | |
| *B82Y 30/00* | (2011.01) | |

(52) U.S. Cl.
CPC ....... *C23C 16/4417* (2013.01); *C23C 16/45555* (2013.01); *C23C 16/45559* (2013.01); *G11B 5/84* (2013.01); *B82Y 30/00* (2013.01)
USPC ............ 216/75; 216/41; 427/240; 427/248.1; 427/127

(58) Field of Classification Search
None
See application file for complete search history.

(56) References Cited

U.S. PATENT DOCUMENTS

| | | | | |
|---|---|---|---|---|
| 6,162,532 | A * | 12/2000 | Black et al. | .................... 428/323 |
| 6,262,129 | B1 | 7/2001 | Murray et al. | |
| 8,048,546 | B2 | 11/2011 | Albrecht et al. | |
| 2008/0238294 | A1 | 10/2008 | Xu et al. | |
| 2009/0086358 | A1 | 4/2009 | Van de Veerdonk et al. | |
| 2010/0092841 | A1* | 4/2010 | Lopez et al. | ..................... 429/44 |
| 2010/0124638 | A1 | 5/2010 | Xiao et al. | |

OTHER PUBLICATIONS

Peng et al., Acs Nano 5 (6), 4600-4606 (2011).
George, "Atomic Layer Deposition: An Overview", Chemical Review, 2010, vol. 110, No. 1, 111-131.
Wang et al., "Iron oxide—gold core—shell nanoparticles and thin film assembly", J. Mater. Chem., 2005, 15, 1821-1832.
Fischer et al., "Completely Miscible Nanocomposites", Angew. Chem. Int. Ed. 2011, 50, 7811-7814.

(Continued)

*Primary Examiner* — Binh X Tran
*Assistant Examiner* — David Cathey, Jr.
(74) *Attorney, Agent, or Firm* — Thomas R. Berthold

(57) ABSTRACT

A method for making a film of core-shell nanoparticles generally uniformly arranged on a substrate uses atomic layer deposition (ALD) to form the shells. The nanoparticle cores are placed in a solution containing a polymer having an end group for attachment to the cores. The solution is then applied to a substrate and allowed to dry, resulting in the nanoparticle cores being uniformly arranged by the attached polymer chains. ALD is then used to grow the shell material on the cores, using two precursors for the shell material that are non-reactive with the polymer. The polymer chains also form between the cores and the substrate surface, so the ALD forms shell material completely surrounding the cores. The uniformly arranged core-shell nanoparticles can be used as an etch mask to etch the substrate.

21 Claims, 2 Drawing Sheets

(56) References Cited

OTHER PUBLICATIONS

Talapin, "Nanocrystal solids: A modular approach to materials design", MRS Bulletin 37, 63-71 (2012).

Green, "Solution routes to III-V semiconductor quantum dots", Current Opinion in Solid State and Materials Science 6, pp. 355-363 (2002).

Murray et al., Annual Review of Materials Science 30 (1), 545-610 (2000).

* cited by examiner

METHOD FOR MAKING A FILM OF UNIFORMLY ARRANGED CORE-SHELL NANOPARTICLES ON A SUBSTRATE

BACKGROUND OF THE INVENTION

1. Field of the Invention

This invention relates generally to a method to fabricate a uniform pattern of core-shell nanoparticles on a substrate.

2. Description of the Related Art

Core-shell nanoparticles comprise core nanoparticles (also called nanocrystals) of one material surrounded by a uniform shell of another material. The fabrication of core-shell nanoparticles presents numerous challenges. Current methods use either oxidation or reduction chemistry of bulk core nanoparticles, as described in C. B. Murray, et al., *Annual Review of Materials Science* 30 (1), 545-610 (2000). However, these methods make it difficult to process core-shell nanoparticles after they are formed, and also limits the type of materials that can be used for the shell. Another method is to deposit a film of core nanoparticles on a substrate and subsequently coat them from the top with the shell material, but this often results in non-uniform shells.

It is even more challenging to fabricate a monolayer of uniformly dispersed core-shell nanoparticles on a substrate. Such a structure has applications in making magnetic recording disks, including patterned-media disks.

What is needed is a method to fabricate a uniform pattern of core-shell nanoparticles on a substrate.

SUMMARY OF THE INVENTION

The invention relates to a method for making a film of core-shell nanoparticles generally uniformly arranged on a substrate. The nanoparticle cores are placed in a solution containing a polymer having an end group for attachment to the cores. The solution is then applied to a substrate and allowed to dry. This results in the nanoparticle cores being generally uniformly arranged on the substrate and spaced apart by the attached polymer chains. After the film has been deposited on the substrate, atomic layer deposition (ALD) is used to grow the shell material on the cores, using two precursors for the shell material that are non-reactive with the polymer. This forms a very thin film of shell material around the cores. Repeated cycles of precursor introduction into the ALD chamber grow the shells to the desired thickness. The polymer chains also form between the cores and the substrate surface, so the ALD forms shell material completely surrounding the cores, including in the portions of the cores that are facing the substrate surface. The polymer is then removed. The resulting uniformly arranged core-shell nanoparticles can be used as an ordered nucleation layer for the magnetic recording layer in a magnetic recording disk. For example, the substrate may be a suitable magnetic recording disk underlayer, like ruthenium (Ru) or a Ru alloy, for an oxide-containing Co-alloy magnetic recording layer.

The uniformly arranged core-shell nanoparticles can also be used as an etch mask to etch the substrate. The etched substrate that remains after removal of the core-shell nanoparticles can have several applications in the making of magnetic recording disks, including bit-patterned media (BPM) disks. If it is desired to form a nanoimprinting stamper or template for making BPM disks using the method of this invention, the substrate may be formed of any suitable template material, like fused quart. If it is desired to form a BPM magnetic recording layer, the substrate may be a layer of magnetic recording material, like a Co-alloy or FePt.

For a fuller understanding of the nature and advantages of the present invention, reference should be made to the following detailed description taken together with the accompanying figures.

DETAILED DESCRIPTION OF THE INVENTION

Figure 1A:
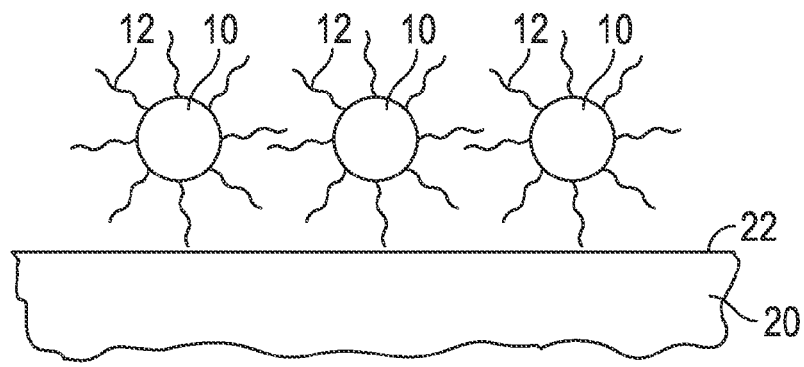
FIG. 1A is a side sectional schematic view of a film of nanoparticle cores, each with attached polymer chains, located on the generally planar surface of a substrate according to the method of the invention.

Nanoparticles (also called nanocrystals) include small sub-100 nm sized crystalline particles whose core is composed of one or more materials such as CdSe, CdTe, PbSe, FePt, iron oxide (FeOx), Si, ZnO, Au, Ru, Cu, Ag, and vanadium oxide ($VO_x$). Nanoparticles can be synthesized in a variety of sizes and with narrow size distributions. For example, CdSe nanoparticles are commercially available with diameters ranging from 2-7 nm and diameter distributions of less than 10%. Other semiconductor nanoparticles are also available. This includes III-V semiconductors as described in D. V. Talapin, *MRS Bulletin* 37, 63-71 (2012) and in Green, "Solution routes to III-V semiconductor quantum dots", *Current Opinion in Solid State and Materials Science* 6, pp. 355-363 (2002).

In the method of this invention to fabricate a thin film of core-shell nanoparticles uniformly arranged on a substrate, the core nanoparticles are first coordinated with polymeric chains in a solution containing polymers having functional end groups that attach to the surface of the cores. The long polymeric chains also prevent aggregation and clustering. The dissolved core nanoparticles with attached polymers can be applied by spin coating, liquid immersion or spraying to form thin films of core nanoparticles on a substrate. The polymer chains result in the core nanoparticles being spaced apart and arranged in a generally uniform pattern. This process is known and has been described for CdSe nanoparticles coated with polystyrene having diamine or carboxylic acid end groups. Fischer et al., "Completely Miscible Nanocomposites", *Angew. Chem. Int. Ed.* 2011, 50, 7811-7814. In a related process Fe oxide-Au core-shell nanoparticles are first synthesized and dissolved in a solution containing mercaptoundecanoic acid. After the solution is applied to a substrate, the core-shell nanoparticles become generally uniformly arranged as a thin film due to crosslinking of the polymer attached to the gold shells, resulting in the core-shell nanoparticles being attached to neighboring core-shell nanoparticles. Wang et al., "Iron oxide-gold core-shell nanoparticles and thin film assembly", *J. Mater. Chem.*, 2005, 15, 1821-1832.

In the method of this invention, atomic layer deposition (ALD) is used to form the shells around the nanoparticle cores. ALD is known as a process for forming very thin films on a substrate. ALD involves deposition of gas phase precursor molecules. Most ALD processes are based on binary reaction sequences where two surface reactions occur and deposit a binary compound film, such as the use of trimethylaluminum (TMA) and $H_2O$ to form $Al_2O_3$. An overview of ALD is presented by George, "Atomic Layer Deposition: An Overview", *Chemical Review*, 2010, Vol. 110, No. 1, 111-131.

In the method of this invention core nanoparticles are dissolved in a solution containing a polymer with a functional end group for attachment to the cores. The solution is then deposited on the substrate by spin-coating, liquid immersion or spraying. This results in a film of generally uniformly arranged core nanoparticles with attached polymer chains. After the film has been deposited on the substrate, ALD is used to grow the shell material on the cores. However, the method of the invention is not merely an obvious combination of these two known processes. This is because it has been discovered that the polymer chains also form between the cores and the substrate surface. While ALD is known for forming very thin films that conform to a substrate surface, in this invention the ALD forms shell material completely surrounding the cores, including in the portions of the cores that are facing the substrate surface. Additionally it is a critical requirement of the invention that the ALD precursors be materials that do not react with the polymer chains. This would cause the ALD-grown material to also grow everywhere in the polymer matrix. The combination of substrate-core separation and selective ALD reaction sites allows for an ALD coated core that completely surrounds the nanoparticle.

Figure 1B:
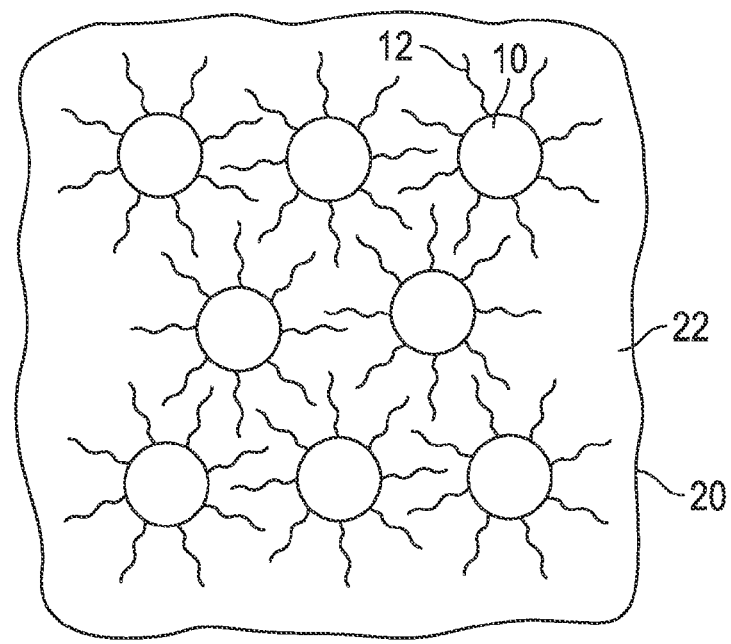
FIG. 1B is a schematic top view of the structure of FIG. 1A showing the generally uniform hexagonal pattern of the nanoparticle cores on the substrate surface.

The invention will be described for an example where the core nanoparticles are iron-oxide ($Fe_3O_4$), the polymer is polystyrene with an end group of COOH, and the shell material is alumina ($Al_2O_3$). FIG. 1A is a side sectional schematic showing a film of $Fe_3O_4$ cores 10, each with attached polystyrene chains 12, located on the generally planar surface 22 of a substrate 20 after a solution of the cores and polystyrene was deposited on the substrate by spin coating and allowed to dry. The substrate 20 may be a wafer or disk of a material such as, but not limited to, Si, fused quartz, carbon, a silicon nitride ($SiN_x$), Cr, Ta, Mo, Ru, Ru-alloy or a layer of magnetic media, like a Co-alloy or FePt. $Fe_3O_4$ nanocrystals with a diameter of about 5 nm and having polysterene ligands (~8 Kg/mol) were dissolved in toluene at a concentration of about 5 mg/ml. The cores 10 are supported above the substrate surface 22 by the polystyrene chains 12. The cores 10 are arranged in a hexagonal pattern on the substrate surface 22, as a result of the attached polystyrene chains 12, as shown by the top schematic of FIG. 1B. As an optional step after the solution has been applied to the substrate surface 22, the substrate 20 may be solvent annealed or thermally annealed, or both, for example by exposing the spin coated film to a toluene vapor or by thermally annealing at 250° C., to facilitate organization of the core nanoparticles 10 into the generally uniform hexagonal pattern.

Figure 2:
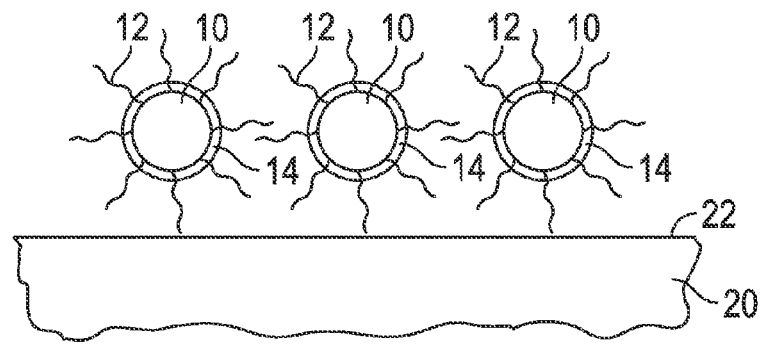
FIG. 2 is a side sectional schematic view of a film of nanoparticle cores after formation of the shells according to the method of the invention.

The structure of FIG. 1A is then placed into a ALD chamber, such as those available from Cambridge Nanotech Inc. of Cambridge, Mass. A first precursor of TMA is then introduced, followed by a second precursor of water, as described in detail in the prior art reference by George. For the purposes of this invention, it is preferred to run the ALD tool in semi-static mode, as described in Peng et al., *Acs Nano* 5 (6), 4600-4606 (2011). The sample is introduced in the ALD chamber and the substrate is held at a desired temperature (~100° C.). With the vacuum pump valve closed, the first precursor, in this case TMA, is introduced into the chamber to reach a target pressure (~1 Torr). The precursor is then allowed to diffuse into the film for a given dwelling time (~5 min). During this time the precursor diffuses through the polymer matrix and when it finds the nanocrystal material it reacts with oxide or OH groups that may be at the nanocrystal/polymer interface, forming a bond that attaches the TMA precursor to the nanocrystal interface. Because the polymer ligand is chosen to be inert to the precursor, the TMA only attaches at the interface of the particle and not to the matrix of polystyrene. After the dwelling time, the chamber is purged by opening the vacuum line valve and by introducing an inert gas. At this point all unreacted precursor is pumped out of the film (and the chamber), leaving only those molecules that were attached at the surface of the nanocrystals. After the purging cycles, the second precursor, in this case $H_2O$, is introduced into the chamber with the vacuum valve closed until a certain pressure is reached (~1 Torr). Similarly, the water molecules are allowed to diffuse inside the film for a certain dwelling time (~5 min). Water molecules react with the attached TMA (from the first precursor), forming aluminum oxide ($Al_2O_3$) and methane ($CH_4$). The $CH_4$ is a volatile gas that goes to the gas phase. At the end of the dwelling time, the chamber is purged again, pumping away all of the unreacted water and the $CH_4$ by-products. This results in a very thin film (e.g., 0.5 to 5 Å) of $Al_2O_3$ on the surface of the cores. The binary reaction with the two precursors is then repeated a number of times until the desired shell thickness is achieved. For certain applications, it may be desired to grow the shell until it touches or gets close to the substrate. This provides additional mechanical stability in applications where the polymer matrix needs to be removed, as in this example. Because the polystyrene supports the cores 10 above the substrate surface 22, the $Al_2O_3$ grows complete around the spherical surface of the cores, including the region of the cores facing the substrate surface 22. Also, TMA was chosen because it is not reactive with polystyrene so the TMA diffuses through and around the polystyrene without affecting the structure of polystyrene chains 12. FIG. 2 is a sectional schematic view showing the cores 10 with $Al_2O_3$ shells 14 and the unaffected polystyrene chains 12.

The structure of FIG. 2 is then removed from the ALD chamber. The polystyrene is then removed, leaving the ($Fe_3O_4$—$Al_2O_3$) core-shell nanoparticles arranged in a generally uniform pattern on the substrate surface 22, as shown by the sectional schematic of FIG. 3. This can be accomplished by reactive ion etching (RIE) in a plasma containing one or more gases of oxygen, hydrogen, argon, fluorine or chlorine. Because the $Al_2O_3$ shells grow at the surface of the nanoparticle and are inert to the subsequent RIE plasma, the shells remain while the polymer is selectively etched away. The structure of FIG. 3 also has application in magnetic recording media, for example for use as an ordered nucleation layer or template to grow a magnetic recording layer of ferromagnetic Co-alloy grains separated by non-ferromagnetic oxide regions, similar to the method as described in U.S. Pat. No. 8,048,546 B2, which is assigned to the same assignee as this application. Thus if the substrate is a suitable magnetic recording disk underlayer, like ruthenium (Ru) or a Ru alloy, the Co-alloy grains would tend to grow on the substrate and the oxide regions would tend to grow on the shells.

Figure 3:
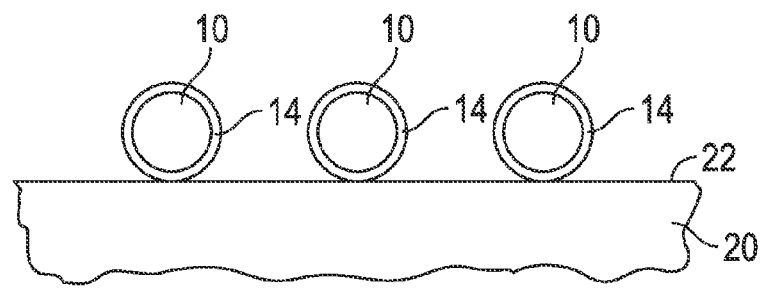
FIG. 3 is a side sectional schematic view of the structure of FIG. 2 after removal of the polymer matrix according to the method of the invention.
Figure 4:
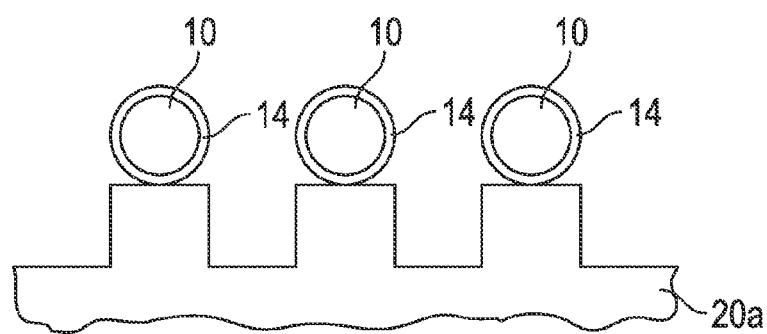
FIG. 4 is a side sectional schematic view of the structure of FIG. 3 after etching of the substrate using the core-shell nanoparticles as an etch mask.

The structure of FIG. 3 may then be etched, using the core-shell nanoparticles as an etch mask, to form an etched substrate 20a, as shown in FIG. 4. The etching may be by RIE. For example, if the substrate is silicon, then the RIE plasma would comprise fluorine and/or chlorine. If the substrate is to be etched then the RIE may also remove the polystyrene, in which case a separate step of removing the polystyrene is not required. However, the polystyrene may be removed in a separate step before the RIE. Following the RIE the core-shell nanoparticles can be removed from the structure of FIG. 4. Shell material formed of $Al_2O_3$ is preferred if the core-shell nanoparticles are to be used as an etch mask because $Al_2O_3$ is an excellent etch mask for a variety of RIE plasma gases. The technique of this invention can be extended for various shell materials with the appropriate choice of substrate to be etched. For example, an AlOx or SiOx shell can be used to etch a Cr substrate layer. A TiOx shell can be used to etch a carbon substrate layer. A HfOx shell can be used to etch a carbon or Si substrate layer. An AlOx shell can be used to etch SiOx, SiN, Si, or Cr substrate layers.

The etched substrate that remains after removal of the core-shell nanoparticles from the structure of FIG. 4 can have several applications in the making of magnetic recording disks, including bit-patterned media (BPM). If it is desired to form a nanoimprinting stamper or template for making BPM disks using the method of this invention, the substrate may be formed of any suitable template material, like fused quart. If it is desired to form a BPM magnetic recording layer, the substrate may be a layer of magnetic recording material, like a Co-alloy or FePt.

Examples of other core nanoparticles include, but are not limited to, zinc-oxide (ZnO), silver (Ag), gold (Au), cadmium selenide (CdSe), cobalt (Co), iron-platinum (FePt), copper (Cu), vanadium oxide (VOx e.g., $VO_2$, $V_2O_3$, $V_2O_5$). Examples of other polymers include, but are not limited to, polydimethyl siloxane, polysiloxane, polyisoprene, polybutadiene, polyisobutylene polypropylene glycol, and polyethylene glycol. Examples of other functional groups for the polymers include, but are not limited to, carbocyl group (COOH), hydroxyl group (OH), amino group ($NH(CH_2)_2NH_2$) and a thiol group (CSH). Examples of other shell materials include $SiO_2$, $TiO_2$, $HfO_2$, $Ta_2O_5$, tungsten (W), zinc oxide (ZnO), The ALD precursors are selected to form the shell material and to be non-reactive with the polymer. For example, if the shell material is to be ZnO and the polymer is polyisoprene, then the precursors may be diethyl zinc and water. For example, if the shell material is to be $SiO_2$ and the polymer is polybutadiene, then the precursors may be tris(tert-pentoxy) silanol and water. For example, if the shell material is to be tungsten and the polymer is polydimethylsiloxane, then the precursors may be tungsten hexafluoride and disilane. In some of these examples, if the first precursor does not readily react with the core material a first $TMA/H_2O$ cycle may be used to grow a first layer of AlOx and then the AlOx surface is used to grow the desired shell material in subsequent cycles.

The method of this invention allows different materials to be chosen for the shell independently of the material chosen for the core, because it does not rely on a chemical reaction with the core material. Also, it is possible to tune the shell layer thickness with sub-nanometer resolution by controlling the number of ALD cycles.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A method for making a film of core-shell nanoparticles generally uniformly arranged on a substrate comprising:

applying the nanoparticle cores in a solution containing a polymer having an end group for attachment to the cores;

applying said solution to a planar substrate to form a film of nanoparticle cores separated by the attached polymer and separated from said substrate by the attached polymer;

placing said substrate in an atomic layer deposition (ALD) chamber;

introducing into the ALD chamber a first precursor for the shell that is non-reactive with the polymer; and introducing into the ALD chamber a second precursor that is non-reactive with the polymer to form a shell around the nanoparticle cores.

2. The method of claim 1 further comprising removing the polymer, leaving a film of uniformly arranged core-shell nanoparticles on the substrate.

3. The method of claim 2 further comprising, after removing the polymer, etching the substrate using the core-shell nanoparticles as an etch mask.

4. The method of claim 2 wherein removing the polymer comprises removing the polymer by reactive ion etching (RIE).

5. The method of claim 4 wherein the RIE also etches the substrate, using the core-shell nanoparticles as an etch mask.

6. The method of claim 1 further comprising repeating the introduction of the first and second precursors to increase the thickness of the shell.

7. The method of claim 1 further comprising, after applying said solution to the substrate, annealing the substrate to facilitate assembly of the nanoparticle cores into a uniform arrangement.

8. The method of claim 1 wherein applying said solution to the substrate is by one of spin-coating, liquid immersion and spray-coating.

9. The method of claim 1 wherein applying said solution to the substrate forms a monolayer of nanoparticle cores.

10. The method of claim 1 wherein the nanoparticle cores are formed of a material selected from $Fe_3O_4$, zinc-oxide (ZnO), silver (Ag), gold (Au), cadmium selenide (CdSe), cobalt (Co), iron-platinum (FePt), copper (Cu) and vanadium oxide.

11. The method of claim 1 wherein the first and second precursors form a shell material selected from $Al_2O_3$, $SiO_2$, $TiO_2$, $HfO_2$, $Ta_2O_5$, ZnO and W.

12. The method of claim 1 wherein the polymer is polystyrene.

13. The method of claim 1 wherein the substrate is formed of a material selected from Si, fused quartz, carbon, $SiN_x$, Cr, Ta, Mo, Ru and a Ru-alloy.

14. The method of claim 1 wherein the substrate comprises a layer of magnetic recording material.

15. A method for making a film of core-shell nanoparticles generally uniformly arranged on a substrate comprising, the core-shell nanoparticles having shells with a predetermined thickness:

applying the nanoparticle cores in a solution containing a polymer having an end group for attachment to the cores;

applying said solution to a planar substrate to form a film of nanoparticle cores separated by the attached polymer;

placing said substrate in an atomic layer deposition (ALD) chamber;

introducing into the ALD chamber a first precursor that is non-reactive with the polymer, the first precursor for forming a shell of material selected from $Al_2O_3$, $SiO_2$, $TiO_2$, $HfO_2$, $Ta_2O_5$, ZnO and W;

introducing into the ALD chamber a second precursor that is non-reactive with the polymer to form a shell of said selected shell material around the nanoparticle cores, said shell having a thickness greater than 0.5 Å and less than 5 Å;

repeating the introduction of said first and second precursors until said shell has a predetermined thickness; and removing the polymer, leaving a film of uniformly arranged core-shell nanoparticles on the substrate.

16. The method of claim 15 further comprising, after applying said solution to the substrate, annealing the substrate to facilitate assembly of the nanoparticle cores into a uniform arrangement.

17. The method of claim 15 wherein removing the polymer comprises removing the polymer by reactive ion etching (RIE).

18. The method of claim 17 wherein the RIE also etches the substrate, using the core-shell nanoparticles as an etch mask.

19. The method of claim 15 wherein the substrate is formed of a material selected from Si, fused quartz, carbon, $SiN_x$, Cr, Ta, Mo, Ru and a Ru-alloy.

20. The method of claim 15 wherein the substrate comprises a layer of magnetic recording material.

21. The method of claim 15 further comprising depositing a layer of magnetic material over the uniformly arranged core-shell nanoparticles on the substrate.

* * * * *